(12) United States Patent
Chae

(10) Patent No.: US 7,429,872 B2
(45) Date of Patent: Sep. 30, 2008

(54) LOGIC CIRCUIT COMBINING EXCLUSIVE OR GATE AND EXCLUSIVE NOR GATE

(75) Inventor: Kwan-Yeob Chae, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 103 days.

(21) Appl. No.: 11/332,633

(22) Filed: Jan. 14, 2006

(65) Prior Publication Data
US 2006/0158221 A1 Jul. 20, 2006

(30) Foreign Application Priority Data
Jan. 18, 2005 (KR) .................. 10-2005-0004483

(51) Int. Cl.
*H03K 19/21* (2006.01)
(52) U.S. Cl. .................. 326/52; 326/54; 326/104; 326/113
(58) Field of Classification Search .............. 326/52, 326/54, 55, 113
See application file for complete search history.

(56) References Cited

U.S. PATENT DOCUMENTS 4,716,312 A * 12/1987 Mead et al. .............. 326/97
5,633,603 A * 5/1997 Lee .............................. 326/83
5,818,255 A * 10/1998 New et al. .................. 326/39

FOREIGN PATENT DOCUMENTS

| JP | 06125267 | 5/1994 |
|---|---|---|
| JP | 08139591 | 5/1996 |
| JP | 09116252 | 5/1996 |
| JP | 11074781 | 3/1999 |
| KR | 1992 0022303 | 12/1992 |
| KR | 1998 0033074 | 9/1998 |

OTHER PUBLICATIONS

English Abstract***.

* cited by examiner

*Primary Examiner*—Vibol Tan
(74) *Attorney, Agent, or Firm*—F. Chau & Associates, LLC

(57) ABSTRACT

A logic circuit combining an exclusive OR gate and an exclusive NOR gate is provided. The logic circuit includes an NMOS transistor, a PMOS transistor, and first and second inverters. The NMOS transistor has a source connected to a first input signal, a drain connected to a first output signal, and a gate connected to a second input signal. The PMOS transistor has a source connected to the first input signal, a drain connected to a second output signal, and a gate connected to the second input signal. The first inverter receives the first output signal and outputs the second output signal. The second inverter receives the second output signal and outputs the first output signal.

7 Claims, 4 Drawing Sheets

| A | B | Y |
|---|---|---|
| 0 | 0 | 0 |
| 0 | 1 | 1 |
| 1 | 0 | 1 |
| 1 | 1 | 0 |

| A | B | Y |
|---|---|---|
| 0 | 0 | 1 |
| 0 | 1 | 0 |
| 1 | 0 | 0 |
| 1 | 1 | 1 |

| A | B | X | Y |
|---|---|---|---|
| 0 | 0 | 1 | 0 |
| 0 | 1 | 0 | 1 |
| 1 | 0 | 0 | 1 |
| 1 | 1 | 1 | 0 |

US 7,429,872 B2

LOGIC CIRCUIT COMBINING EXCLUSIVE OR GATE AND EXCLUSIVE NOR GATE

CROSS-REFERENCE TO RELATED PATENT APPLICATIONS

This application claims the benefit of Korean Patent Application No. 10-2005-0004483, filed on Jan. 18, 2005, in the Korean Intellectual Property Office, the disclosure of which is incorporated herein in its entirety by reference.

BACKGROUND OF THE INVENTION

1. Field of the Invention

The present invention relates to a digital circuit, and more particularly, to a logic circuit combining an exclusive OR gate and an exclusive NOR gate.

2. Description of the Related Art

FIG. 1A is a circuit diagram of a conventional exclusive OR gate 100. The exclusive OR gate 100 exclusively ORs a first input signal A and a second input signal B and outputs an output signal Y. The exclusive OR gate 100 includes two branches 110 and 120 between a power supply voltage Vdd and a ground voltage Vss. The first branch 110 includes first and second PMOS transistors 101 and 102 and first and second NMOS transistors 103 and 104, which are connected in series between the power supply voltage Vdd and the ground voltage Vss. The second branch 120 includes third and fourth PMOS transistors 105 and 106 and third and fourth NMOS transistors 107 and 108, which are connected in series between the power supply voltage Vdd and the ground voltage Vss. The drains of the respective second and fourth PMOS transistors 102 and 106 and first and third NMOS transistors 103 and 107 are connected, thereby generating the output signal Y.

The gate of the first PMOS transistor 101 is connected to the second input signal B. The gate of the second PMOS transistor 102 is connected to an inverted first input signal $\overline{A}$. The gate of the first NMOS transistor 103 is connected to the first input signal A. The gate of the second NMOS transistor 104 is connected to the second input signal B. The gate of the third PMOS transistor 105 is connected to an inverted second input signal B. The gate of the fourth PMOS transistor 106 is connected to the first input signal A. The gate of the third NMOS transistor 107 is connected to the inverted first input signal $\overline{A}$. The gate of the fourth NMOS transistor 108 is connected to the inverted second input signal B.

When the first input signal A and the second input signal B are at the same logic level, the exclusive OR gate 100 generates a logic "0". When the first input signal A and the second input signal B are at different logic levels, the exclusive OR gate 100 generates a logic "1". Such operation is illustrated in a truth table shown in FIG. 1B.

FIG. 2A is a circuit diagram of a conventional exclusive NOR gate 200. The exclusive NOR gate 200 has the same structure as the exclusive OR gate 100 shown in FIG. 1A but has different connections of the first and second input signals A and B than the exclusive OR gate 100. In detail, the gate of the first PMOS transistor 101 is connected to the second input signal B. The gate of the second PMOS transistor 102 is connected to the first input signal A. The gate of the first NMOS transistor 103 is connected to the inverted first input signal $\overline{A}$. The gate of the second NMOS transistor 104 is connected to the second input signal B. The gate of the third PMOS transistor 105 is connected to the inverted second input signal B. The gate of the fourth PMOS transistor 106 is connected to the inverted first input signal $\overline{A}$. The gate of the third NMOS transistor 107 is connected to the first input signal A. The gate of the fourth NMOS transistor 108 is connected to the inverted second input signal B.

When the first input signal A and the second input signal B are at the same logic level, the exclusive NOR gate 200 generates a logic "1". When the first input signal A and the second input signal B are at different logic levels, the exclusive OR gate 100 generates a logic "0". Such operation is illustrated in a truth table shown in FIG. 2B.

FIG. 3 is a circuit diagram of another conventional exclusive OR gate 300. The exclusive OR gate 300 includes first and second PMOS transistors 301 and 302 connected in series between a first input signal A and a second input signal B, first and second NMOS transistors 303 and 304 connected in series between the first input signal A and an inverted second input signal B, and an inverter 305. The inverter 305 receives the second input signal B and outputs the inverted second input signal B. The gate of the first PMOS transistor 301 is connected to the second input signal B. The gate of the second PMOS transistor 302 is connected to the first input signal A. The gate of the first NMOS transistor 303 is connected to the inverted second input signal B. The gate of the second NMOS transistor 304 is connected to the first input signal A. The drains of the respective first and second PMOS transistors 301 and 302 and of the respective first and second NMOS transistors 303 and 304 are connected, thereby generating an output signal Y. A truth table for the exclusive OR gate 300 is the same as that shown in FIG. 1B.

FIG. 4 is a circuit diagram of another conventional exclusive NOR gate 400. The exclusive NOR gate 400 has the same structure as the exclusive OR gate 300, with the exception that PMOS transistors are exchanged with the NMOS transistors. In detail, the exclusive NOR gate 400 includes first and second NMOS transistors 401 and 402 connected in series between the first input signal A and the second input signal B, first and second PMOS transistors 403 and 404 connected in series between the first input signal A and the inverted second input signal B, and an inverter 405. The inverter 405 receives the second input signal B and outputs the inverted second input signal B. The gate of the first NMOS transistor 401 is connected to the second input signal B. The gate of the second NMOS transistor 402 is connected to the first input signal A. The gate of the first PMOS transistor 403 is connected to the inverted second input signal B. The gate of the second PMOS transistor 404 is connected to the first input signal A. The drains of the respective first and second NMOS transistors 401 and 402 and of the first and second PMOS transistors 403 and 404 are connected, thereby generating an output signal Y. A truth table for the exclusive NOR gate 400 is the same as that shown in FIG. 2B.

As described above, the exclusive OR gates 100 or 300 and the exclusive NOR gates 200 or 400 can be implemented from each other by changing the connection of input signals or changing the arrangement of transistors.

However, to implement both an exclusive OR gate and an exclusive NOR gate, two circuits are needed. If both an exclusive OR gate and an exclusive NOR gate can be implemented using a single circuit, use of a digital circuit can be extended. Accordingly, a logic circuit combining an exclusive OR gate and an exclusive NOR gate is desired.

SUMMARY OF THE INVENTION

The present invention provides a logic circuit combining an exclusive OR gate and an exclusive NOR gate.

According to an aspect of the present invention, there is provided a logic circuit combining an exclusive OR gate and an exclusive NOR gate, the logic circuit including an NMOS transistor having a source connected to a first input signal, a drain connected to a first output signal, and a gate connected to a second input signal; a PMOS transistor having a source connected to the first input signal, a drain connected to a second output signal, and a gate connected to the second input signal; a first inverter receiving the first output signal and outputting the second output signal; and a second inverter receiving the second output signal and outputting the first output signal.

Accordingly, the logic circuit of the present invention simultaneously performs an exclusive OR operation and an exclusive NOR operation on two input signals.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF PREFERRED EMBODIMENTS

Figures 1A, 1B:
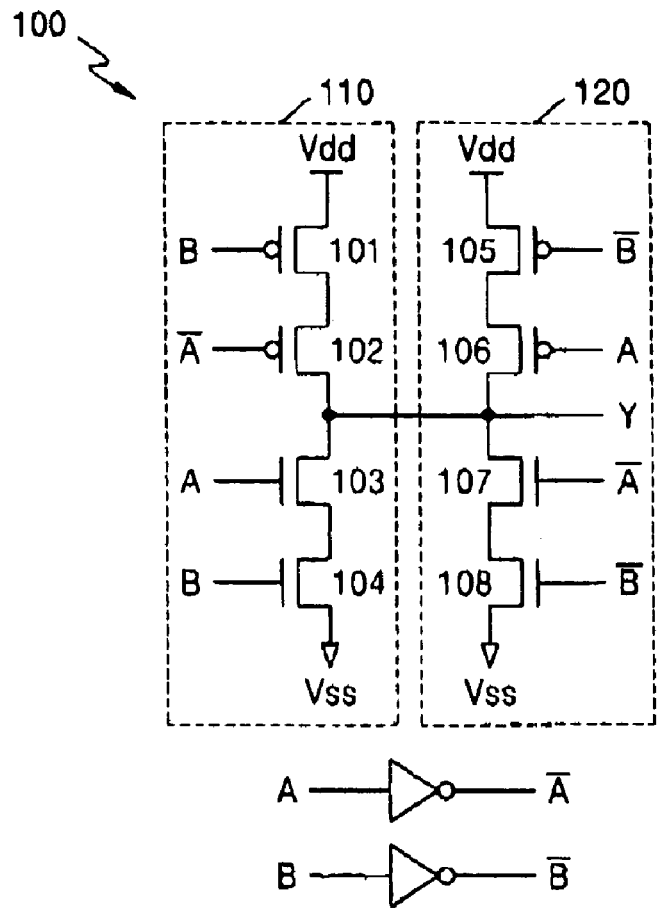
FIG. 1A is a circuit diagram of a conventional exclusive OR gate.
FIG. 1B illustrates a truth table for the exclusive OR gate shown in FIG. 1A.
Figures 2A, 2B:
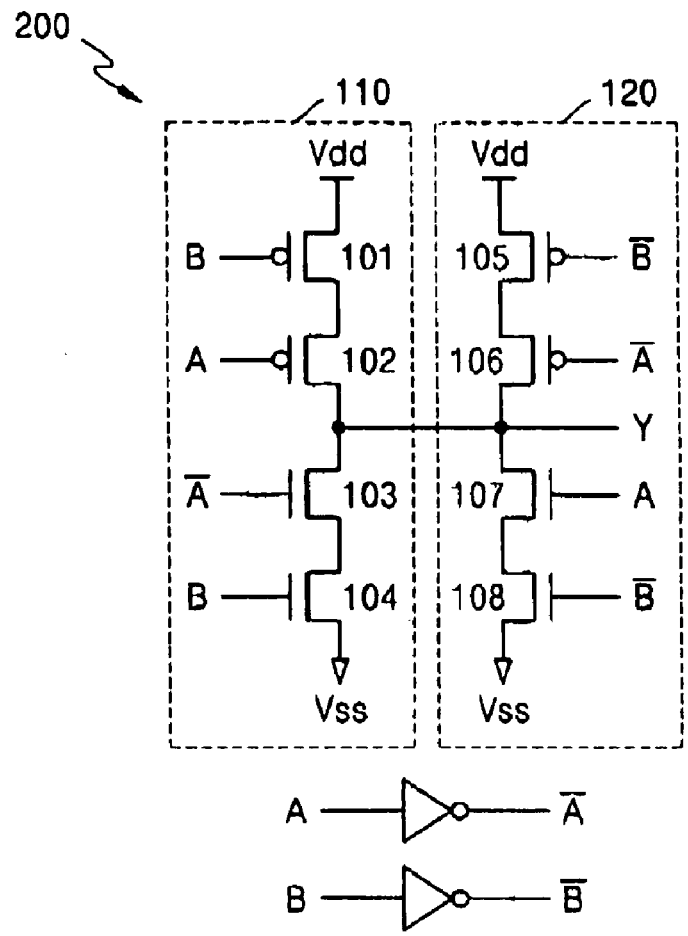
FIG. 2A is a circuit diagram of a conventional exclusive NOR gate.
FIG. 2B illustrates a truth table for the exclusive NOR gate shown in FIG. 2A.
Figure 3:
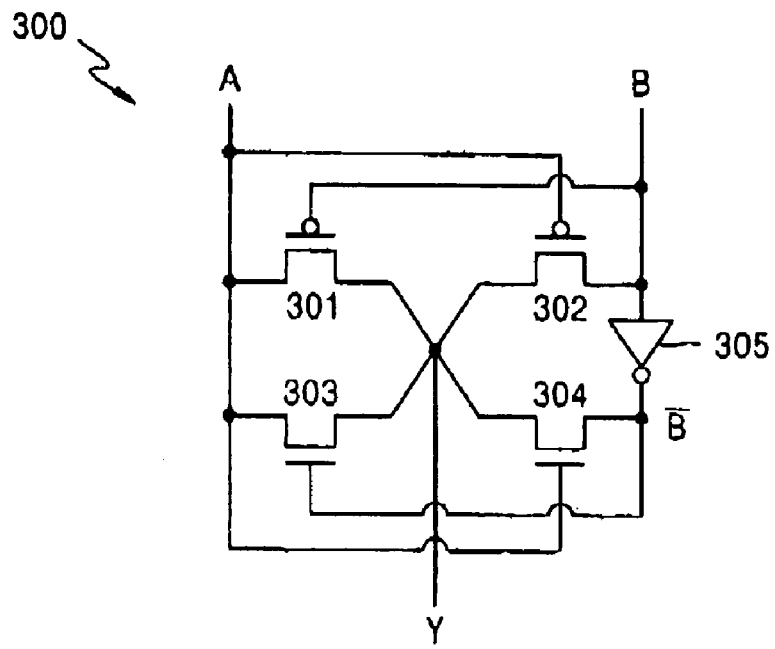
FIG. 3 is a circuit diagram of another conventional exclusive OR gate.
Figure 4:
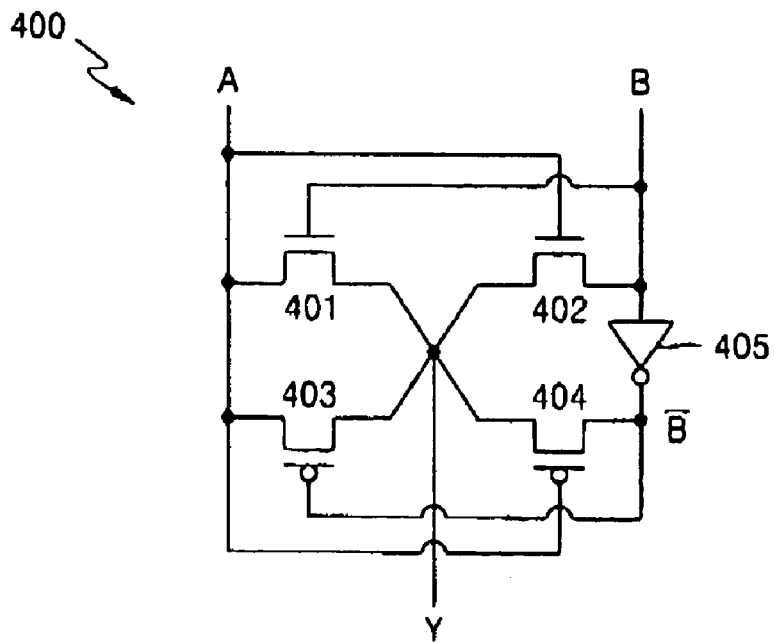
FIG. 4 is a circuit diagram of another conventional exclusive NOR gate.

The present invention will be described in detail by explaining preferred embodiments of the invention with reference to the attached drawings, wherein like reference numerals denote like elements.

Figures 5A, 5B:
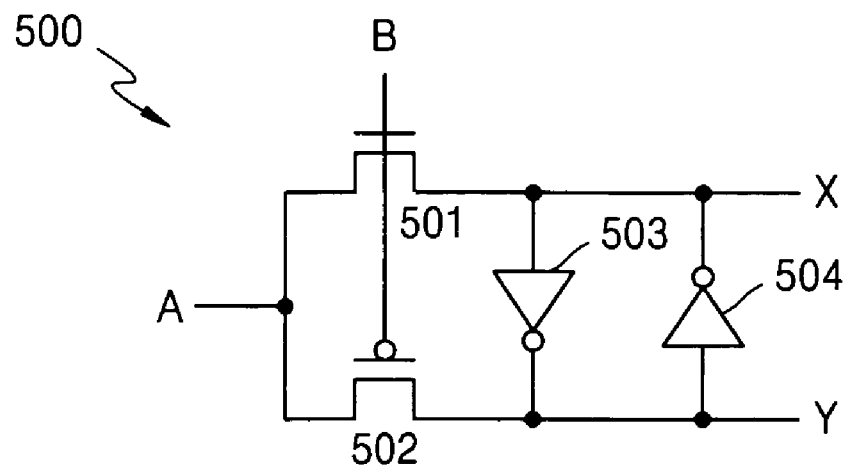
FIG. 5A is a diagram of a logic circuit combining an exclusive OR gate and an exclusive NOR gate according to an embodiment of the present invention.
FIG. 5B illustrates a truth table for the logic circuit shown in FIG. 5A.

FIG. 5A is a diagram of a logic circuit 500 combining an exclusive OR gate and an exclusive NOR gate according to an embodiment of the present invention. The logic circuit 500 includes an NMOS transistor 501, a PMOS transistor 502, a first inverter 503, and a second inverter 504. The NMOS transistor 501 has a source connected to a first input signal A, a drain connected to a first output signal X, and a gate connected to a second input signal B. The PMOS transistor 502 has a source connected to the first input signal A, a drain connected to a second output signal Y, and a gate connected to the second input signal B. The first inverter 503 receives the first output signal X and outputs the second output signal Y. The second inverter 504 receives the second output signal Y and outputs the first output signal X.

The following description concerns the operation of the logic circuit 500.

When the second input signal B is at a logic "1", the NMOS transistor 501 is turned on and outputs the first output signal X at the logic level of the first input signal A. At the same time, the PMOS transistor 502 is not turned on. The second output signal Y has an opposite logic level to the first output signal X from the first inverter 503. When the second input signal B is at a logic "0", the PMOS transistor 502 is turned on and outputs the second output signal Y at the logic level of the first input signal A. At the same time, the NMOS transistor 501 is not turned on. The first output signal X has an opposite logic level to the second output signal Y from the second inverter 504.

FIG. 5B illustrates a truth table for the logic circuit shown in FIG. 5A. Referring to FIG. 5B, the first output signal X has a logic value corresponding to a result of exclusively ORing the first input signal A and the second input signal B and the second output signal Y has a logic value corresponding to a result of exclusively NORing the first input signal A and the second input signal B. Accordingly, the logic circuit 500 simultaneously performs an exclusive OR operation and an exclusive NOR operation on the two input signals A and B.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A logic circuit combining an exclusive OR logic function and an exclusive NOR logic function, the logic circuit comprising:
    a first switch passing a first input signal as a first output signal when a second input signal is active and the first switch blocking the first input signal when the second input signal is inactive;
    a second switch passing the first input signal as a second output signal when the second input signal is inactive and blocking the first input signal when the second input signal is active;
    a first inverter receiving, inverting and outputting the first output signal as the second output signal when the first switch passes the first input signal; and
    a second inverter receiving, inverting and outputting the second output signal as the first output signal when the second switch passes the first input signal,
    wherein the first output signal is a logical exclusive NOR of the first and second input signal and the second output signal is a logical exclusive OR of the first and second input signal.

2. The logic circuit of claim 1, wherein the first switch is an NMOS transistor having a source connected to the first input signal, a drain connected to the first output signal, and a gate connected to the second input signal.

3. The logic circuit of claim 1, wherein the second switch is a PMOS transistor having a source connected to the first input signal, a drain connected to the second output signal, and a gate connected to the second input signal.

4. A logic circuit combining an exclusive OR gate and an exclusive NOR gate, the logic circuit comprising:
    an NMOS transistor having a source connected to a first input signal, a drain connected to a first output signal, and a gate connected to a second input signal;
    a PMOS transistor having a source connected to the first input signal, a drain connected to a second output signal, and a gate connected to the second input signal;
    a first inverter receiving the first output signal and outputting the second output signal; and
    a second inverter receiving the second output signal and outputting the first output signal,
    wherein the first output signal is a logical exclusive NOR of the first and second input signal and the second output signal is a logical exclusive OR of the first and second input signal.

5. A logic circuit combining an exclusive OR logic function and an exclusive NOR logic function, the logic circuit comprising:
a first input node connected to first terminals of first and second switches;
a second input node connected to activation terminals of the first and second switches;
a first output node connected to a second terminal of the first switch, an input of a first inverter and an output of a second inverter; and
a second output node connected to a second terminal of the second switch, an output of the first inverter and an input of the second inverter,
wherein the first switch passes a first input signal present on the first input node if a second input signal present on the second input node is in an active logic state and blocks the first input signal present on the first input node if the second input signal present on the second input node is in an inactive logic state,
the second switch blocks a first input signal present on the first input node if the second input signal present on the second input node is in the active logic state and passes the first input signal present on the first input node if the second input signal present on the second input node is in the inactive logic state,
the first inverter inverts a logic state present on the first output node and imparts the inverted logic state present on the first output node to the second output node, the second inverter inverts a logic state present on the second output node and imparts the inverted logic state present on the second output node to the first output node,
the first output node provides a first output signal from the logic state present on the first output node resulting from either the first switch if it passes the first input signal or the second inverter if the second switch passes the first input signal,
the second output node provides a second output signal resulting from the second switch if the second switch passes the first input signal or the first inverter if the second switch passes the second input signal, and
the first output signal is a logical exclusive NOR of the first and second input signal and the second output signal is a logical exclusive OR of the first and second input signal.

6. The logic circuit of claim 5, wherein the first switch is an NMOS transistor having a source connected to the first input node, a drain connected to the first output node, and a gate connected to the second input node.

7. The logic circuit of claim 5, wherein the second switch is a PMOS transistor having a source connected to the first input node, a drain connected to the second output node, and a gate connected to the second input node.

* * * * *